United States Patent
Wang et al.

(10) Patent No.: US 10,573,686 B2
(45) Date of Patent: Feb. 25, 2020

(54) EPITAXIAL AlN/CREO STRUCTURE FOR RF FILTER APPLICATIONS

(71) Applicant: IQE plc, St. Mellons, Cardiff (GB)

(72) Inventors: Wang Nang Wang, Limpley Stoke (GB); Andrew Clark, Mountain View, CA (US); Rytis Dargis, Oak Ridge, NC (US); Michael Lebby, San Francisco, CA (US); Rodney Pelzel, Emmaus, PA (US)

(73) Assignee: IQE plc, St. Mellons, Cardiff (GB)

( * ) Notice: Subject to any disclaimer, the term of this patent is extended or adjusted under 35 U.S.C. 154(b) by 0 days.

(21) Appl. No.: 16/307,588

(22) PCT Filed: Jun. 19, 2017

(86) PCT No.: PCT/US2017/038142
§ 371 (c)(1),
(2) Date: Dec. 6, 2018

(87) PCT Pub. No.: WO2017/222990
PCT Pub. Date: Dec. 28, 2017

(65) Prior Publication Data
US 2019/0305039 A1    Oct. 3, 2019

Related U.S. Application Data
(60) Provisional application No. 62/351,995, filed on Jun. 19, 2016.

(51) Int. Cl.
*H01L 27/20* (2006.01)
*H01L 29/20* (2006.01)
(Continued)

(52) U.S. Cl.
CPC .............. *H01L 27/20* (2013.01); *H01L 23/66* (2013.01); *H01L 29/2003* (2013.01);
(Continued)

(58) Field of Classification Search
CPC ..... H01L 27/20; H01L 23/66; H01L 29/7787; H01L 29/2003; H03H 9/02133;
(Continued)

(56) References Cited

U.S. PATENT DOCUMENTS

| | | | | |
|---|---|---|---|---|
| 6,045,626 | A * | 4/2000 | Yano | H01L 33/007 117/950 |
| 2004/0021400 | A1* | 2/2004 | Bradley | H03H 3/02 310/324 |

(Continued)

FOREIGN PATENT DOCUMENTS

EP    1396889    3/2004

OTHER PUBLICATIONS

International Search Report and Written Opinion in Application No. PCT/US2017/038142, dated Sep. 29, 2017 (15 pages).

*Primary Examiner* — Karen Kusumakar
*Assistant Examiner* — Adam S Bowen
(74) *Attorney, Agent, or Firm* — Haley Guiliano LLP

(57) ABSTRACT

Proposed is a layer structure (1100, 1030) comprising a crystalline piezoelectric III-N layer (1110, 1032) epitaxially grown over a metal layer which is epitaxially grown over a rare earth oxide layer on a semiconductor (1102, 1002). The rare earth oxide layer includes at least two discrete portions (1104, 1004), and the metal layer includes at least one metal portion (1108, 1006) that partially overlaps adjacent discrete portions, preferably forming a bridge over an air gap (1008), particularly suitable for RF filters.

15 Claims, 10 Drawing Sheets

(51) Int. Cl.
  *H01L 29/778* (2006.01)
  *H01L 23/66* (2006.01)
  *H03H 9/02* (2006.01)
  *H03H 9/54* (2006.01)
  *H03H 9/56* (2006.01)
  *H03H 3/02* (2006.01)

(52) U.S. Cl.
  CPC ........... *H01L 29/7787* (2013.01); *H03H 3/02* (2013.01); *H03H 9/02031* (2013.01); *H03H 9/02102* (2013.01); *H03H 9/02133* (2013.01); *H03H 9/545* (2013.01); *H03H 9/562* (2013.01); *H03H 9/564* (2013.01); *H03H 2003/021* (2013.01)

(58) Field of Classification Search
  CPC .. H03H 3/02; H03H 9/02031; H03H 9/02102; H03H 9/564; H03H 9/545; H03H 9/562; H03H 2003/021
  USPC ........................................................ 257/416
  See application file for complete search history.

(56) References Cited

U.S. PATENT DOCUMENTS

| | | | |
|---|---|---|---|
| 2004/0173816 A1 | 9/2004 | Saxler | |
| 2013/0032858 A1* | 2/2013 | Clark | H01L 21/02381 257/190 |
| 2013/0062610 A1* | 3/2013 | Clark | H01L 33/10 257/76 |
| 2013/0334536 A1* | 12/2013 | Dargis | C30B 1/02 257/76 |
| 2014/0167057 A1* | 6/2014 | Arkun | H01L 33/007 257/76 |
| 2014/0231818 A1* | 8/2014 | Arkun | H01L 21/0254 257/76 |
| 2015/0069409 A1* | 3/2015 | Dargis | H01L 21/02433 257/76 |
| 2015/0228484 A1* | 8/2015 | Dargis | H01L 21/02381 438/493 |
| 2016/0380045 A1* | 12/2016 | Machuca | H01L 33/32 257/52 |

* cited by examiner

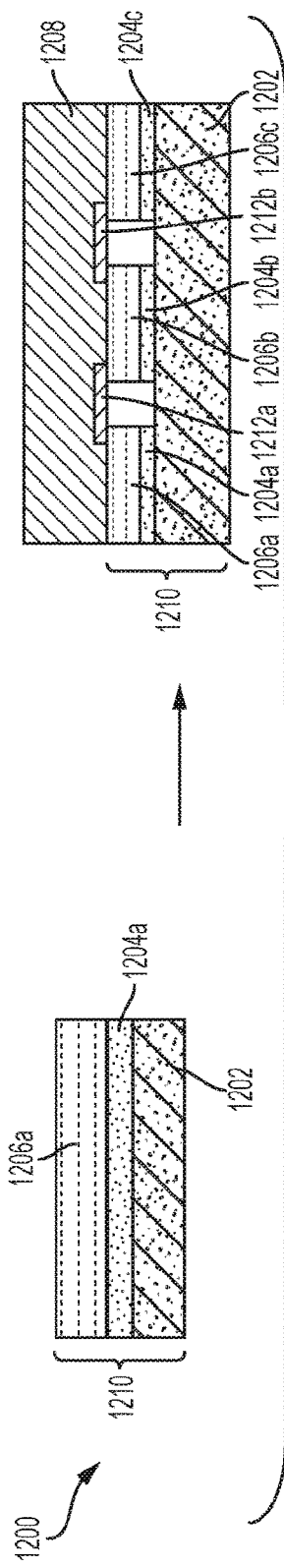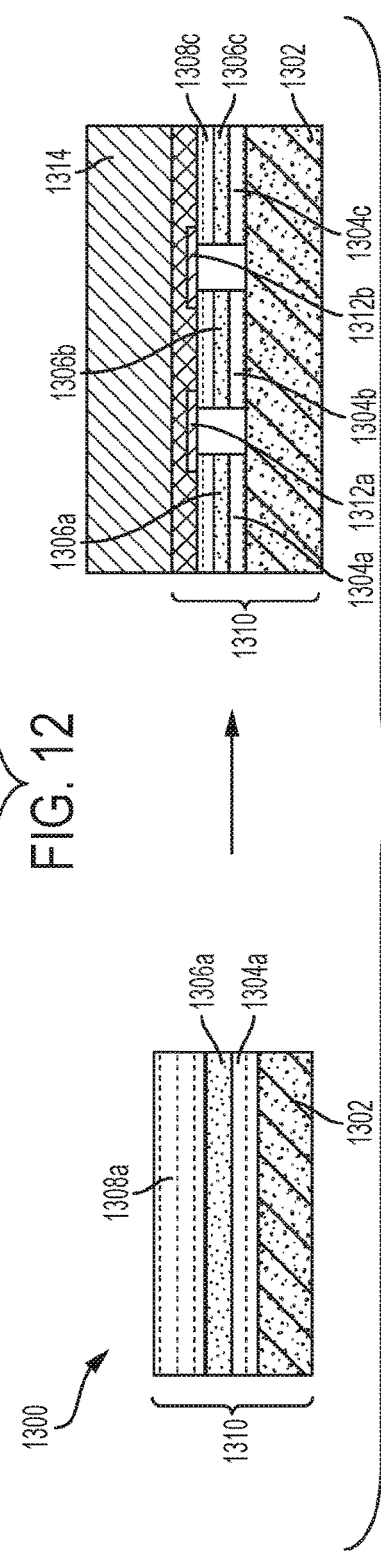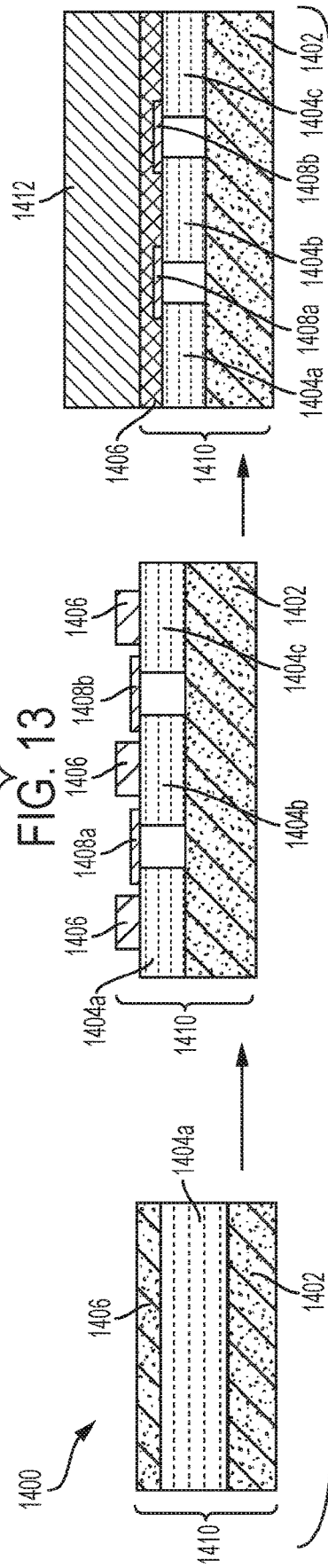

EPITAXIAL AlN/CREO STRUCTURE FOR RF FILTER APPLICATIONS

CROSS-REFERENCE TO RELATED APPLICATIONS

This application is a national stage application under 35 U.S.C. § 371 of International Application PCT/US17/38142, filed Jun. 19, 2017 which claims priority to U.S. Provisional Application Ser. No. 62/351,995, filed Jun. 19, 2016, each of which is hereby incorporated herein by reference in their entireties.

BACKGROUND

For mobile communication handset applications, there is a significant need for radio frequency (RF) filters to ensure appropriate frequency selectivity. As the world appetite for faster and higher quality wireless service has rapidly increased, the frequency spectrum for current wireless applications has become very crowded. As such, filter requirements have become ever more stringent. In certain instances, an RF filter must be capable of selecting immediately adjacent frequency ranges. This presents a significant challenge for filter technology.

Two general types of RF filters are commonly used: Surface Acoustic Wave (SAW) and Bulk Acoustic Wave (BAW). Of BAW filters, there are typically two types: Film Bulk Acoustical Resonator (FBAR) and Solidly Mounted Resonator (SMR). SAW and BAW filters both consist of coupled electro-mechanical resonators that convert electrical signals into acoustical waves of desired resonant frequencies. These resonant frequencies are chosen to give the desired bandpass frequency of the filter.

The response amplitude of an RF filter, as well as the filter's selectivity, are key factors in RF filter performance. Because the resonant frequency and resonance response of a RF filter is dependent of the quality of the piezoelectric material, having good crystal quality in the layers forming an RF filter is essential for device performance.

SUMMARY

System and methods are described herein include layer structures having epitaxial layers that achieve improved performance for RF filters. The piezoelectric layer in an RF filter stack can be crystalline and epitaxial, so its thickness can be controlled more precisely than if it were polycrystalline.

Systems and methods may include a layer structure comprising a semiconductor layer, a first rare earth oxide layer over the semiconductor layer, wherein the first rare earth oxide layer includes a first discrete portion and a second discrete portion, a metal layer epitaxially grown over the first rare earth oxide layer, wherein the metal layer includes a metal portion that overlaps a first region of the first discrete portion and a second region of the second discrete portion, and a III-N layer epitaxially grown over the metal layer, wherein the III-N layer is a crystalline piezoelectric layer.

In some examples, the III-N layer and the metal portion form a bridge over the first discrete portion and the second discrete portion. In some embodiments, the semiconductor layer and the III-N layer are blanket layers. In some examples, the first rare earth oxide layer further includes a third discrete portion, and wherein an additional layer is positioned between the third discrete portion of the first rare earth oxide layer and the III-N layer. In some examples, the metal layer does not include any metal grown over the third discrete portion. In some examples, the additional layer is a blanket layer. In some embodiments, the additional layer includes a second rare earth oxide layer. In some examples, the additional layer includes at least one of a rare earth nitride, a rare earth silicide, and a III-O, and wherein the additional layer improves conductivity of the layer structure.

In some examples, at least a portion of the III-N layer is grown using epitaxial lateral over growth (ELOG). In some examples, a silicon oxide layer may be positioned between the semiconductor layer and the first rare earth oxide layer. In some examples, the III-N layer includes one or more of AlN, Al, Ga, and In. In some examples, the III-N layer includes an alloy of AlN and a rare earth metal. In some examples, an additional rare earth oxide layer is epitaxially grown over the III-N layer. In some examples, a layer of ScN is grown over the III-N layer. In some examples, a III-V layer over the ScN layer.

BRIEF DESCRIPTION OF DRAWINGS

The above and other features of the present disclosure will be more apparent upon consideration of the following detailed description, taken in conjunction with the accompanying drawings in which:

FIG. 12 is a depiction of a schematic representation of an additional layer of silicon oxide over a base silicon substrate, in accordance with an illustrative embodiment;

FIG. 13 is a depiction of a schematic representation of a layer of silicon oxide sandwiched between two cREO layers, in accordance with an illustrative embodiment;

FIG. 14 depicts a schematic representation of an additional layer of silicon over a cREO island grown over a silicon substrate, in accordance with an illustrative embodiment.

DETAILED DESCRIPTION

In the following description, numerous details are set forth for the purpose of explanation. However, one of ordinary skill in the art will realize that the embodiments described herein may be practiced without the use of these specific details. In other instances, well-known structures and devices are shown in block diagram form so that the description will not be obscured with unnecessary detail.

The systems, devices, and methods described herein include, among other things, layer structures having epitaxial layers that achieve improved performance for RF filters. The piezoelectric layer in an RF filter stack can be crystalline and epitaxial, so its thickness can be controlled more precisely than if it were polycrystalline. In particular, as layer thickness decreases, epitaxy results in improved thickness control compared to other deposition methods. RF filters can be evaluated using certain Figures of Merit (FOM), such as a quality factor (Q) or the effective coupling coefficient ($K^2$). High quality interfaces can result in high Q values for RF filters. Q is a measure of a material's mechanical losses and is directly related to filter insertion loss. $K^2$ is a measure of the effectiveness of piezoelectric coupling and is critical in determining a filter's bandwidth. Characteristics of high Q interfaces include low defect levels, sharp transitions, and low roughness. Because the piezoelectric layer described herein is epitaxial and crystalline, the quality of the bulk piezoelectric material is also higher. Q is a function of the identity and quality of the piezoelectric material as well as effectiveness of isolation between piezoelectric medium and the substrate. In addition, making the RF filter stack and the contact layer crystalline enables them to be used as a template for subsequent epitaxial growth of additional layers such as III-nitride layers that can be used in overlying devices.

The most prevalent technology for the current generation of RF filters is FBAR filters incorporating a III-N piezoelectric filter medium and, of these, a sputtered AlN film deposited on a metal film is the most common. The metal film is deposited on a silicon substrate in a separate process step. A key part of an FBAR RF filter structure is the eventual manufacture of a membrane region where the AlN metal is bounded on both sides by air, as illustrated schematically in FIG. 1. This disclosure offers multiple advantages over current technologies including superior thickness control, superior interfacial quality, superior bulk AlN quality, reduced contact losses, and increased integration potential.

Figure 1:
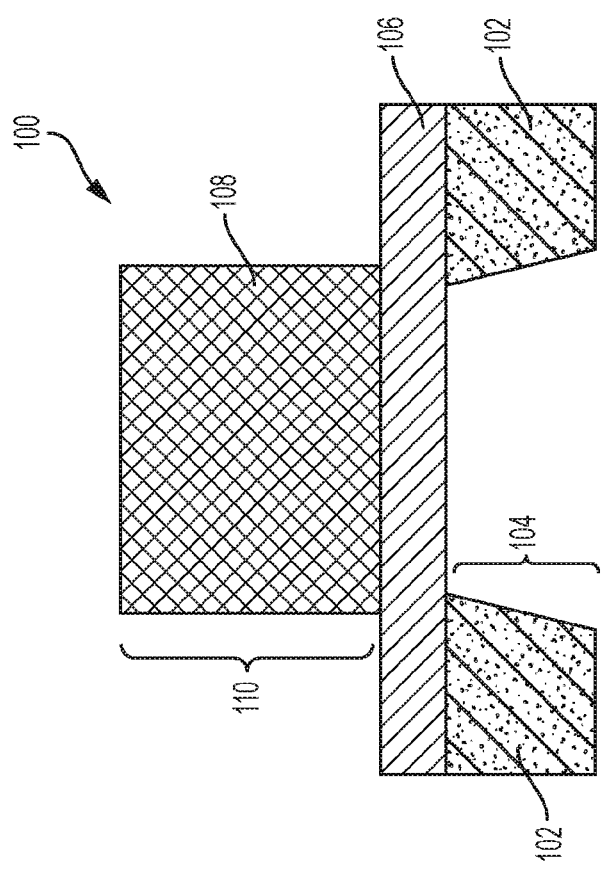
FIG. 1 is a schematic of the FBAR technology, according to prior art.

FIG. 1 depicts a layer structure 100 that includes layers for an RF filter, in accordance with the prior art. The layer structure 100 includes a substrate 102, a metal layer 106 over substrate 102, and an epitaxial piezoelectric layer 108 over the metal layer 106. Layer structure 100 includes air gap 104. One function of the air gap 104 is to increase acoustic isolation in the FBAR.

The epitaxial piezoelectric layer 108 may be any III-N material that exhibits a piezoelectric response, where the III-N material includes alloys of Al, In, and Ga or any combination of these elements. In some embodiments, the piezoelectric layer may include a doped III-N alloy, or a RE-III-N alloy ($III_xRE_{1-x}N$), where the rare earth elements (RE) include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), luthium (Lu), scandium (Sc) and yttrium (Y). The substrate 102 may be any of single crystal, porous, or combinations of porous and crystalline and can be doped or undoped and have any crystal orientation including <111>, <110>, or <100>, either on or off the axis. Any of the substrates disclosed herein can be SOI type substrates. The thickness of the epitaxial piezoelectric layer 108 can be selected based on Equation 1 below, which defines the relationship between frequency, sound velocity through the layer, and thickness.

$$f_r = v_s/(2 * t_f) \quad [1]$$

where $f_r$ is the frequency, $v_s$ is the velocity of sound through the piezoelectric layer, and $t_f$ is the piezoelectric layer thickness.

The frequency, $f_r$, can be approximately 2.4 GHz, between approximately 2.3-2.7 GHz, between approximately 2-3 GHz, between approximately 1-4 GHz, and between 1-28 GHz. The thickness can be approximately 1 µm, between approximately 0.5-1.5 µm, between approximately 1-10 µm, In some embodiments, the thickness of the piezoelectric layer may accommodate frequencies up to 28 GHz.

As the epitaxial piezoelectric layer 108 is crystalline and epitaxial, its thickness can be controlled more precisely than if it were polycrystalline. In particular, as layer thickness decreases, epitaxy results in improved thickness control compared to other deposition methods.

The epitaxial piezoelectric layer 108 has higher quality interfaces with adjacent layers than if the piezoelectric layer were polycrystalline. High quality interfaces can result in high Q values for the RF filter. Characteristics of high quality interfaces include low defect levels, sharp transitions, and low roughness.

As the piezoelectric layer 108 is epitaxial and crystalline, the quality of the bulk piezoelectric material is higher. This results in increased Q and $K^2$ values, which result in improved performance of the RF filter.

Figure 2:
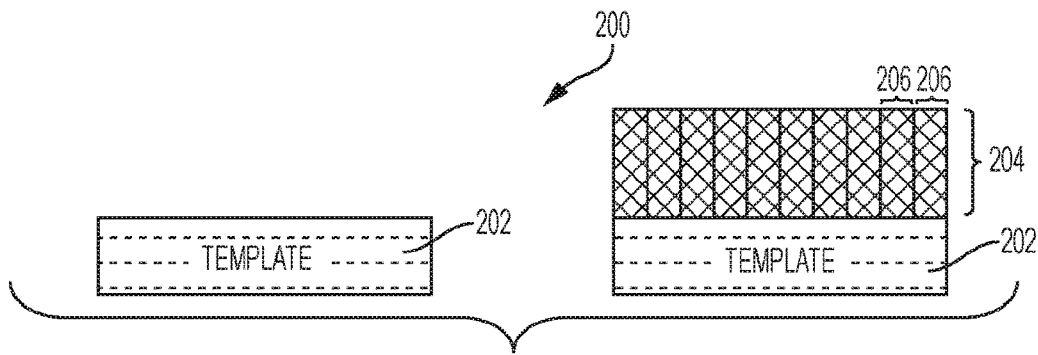
FIG. 2 depicts a schematic representation of a sputtered growth of AlN on a template, according to prior art.
Figure 3:
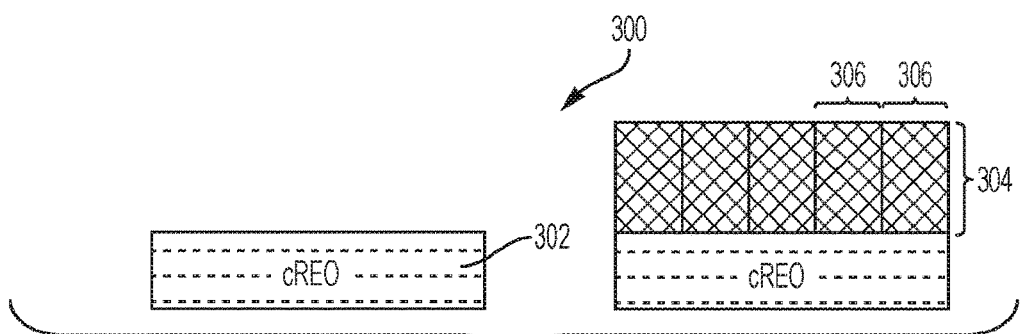
FIG. 3 depicts a schematic representation of a sputtered growth of AlN on a template, according to prior art.
Figure 4:
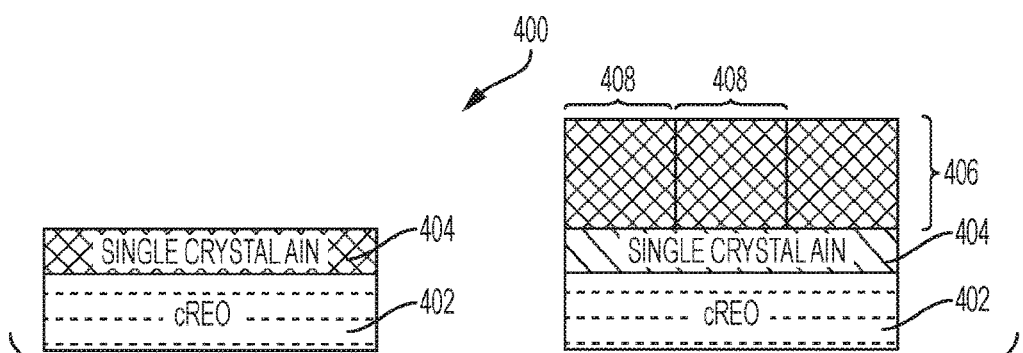
FIG. 4 depicts a schematic representation of a sputtered growth of AlN on a template, according to prior art.

FIGS. 2-4 depict the change in columnar dimensions of AlN as the template over which the AlN is grown using sputter deposition is changed as described in the prior art.

FIG. 2 depicts a schematic representation 200 of growth of AlN 204 on a template 202. In some embodiments, the template 202 includes silicon and metal as described herein. The use of sputter deposition for the growth of AlN 204 over the template 202 results in individual columns 206 of single crystal AlN over the template 202.

FIG. 3 depicts a schematic representation 300 that illustrates the growth of AlN 304 over cREO 302. The term cREO is used to represent crystalline rare earth oxides and crystalline rare earth oxy-nitrides. The change from template 202 to cREO 302 shows an increase in columnar dimensions 306 produced in the AlN 304 grown over the cREO 302 using the same sputter deposition method in FIG. 2.

FIG. 4 depicts a schematic representation 400 that illustrates a thin layer of single crystal AlN 404 deposited on the cREO to form a new template. Additional AlN is then deposited at any time (ex-situ, after removal from the deposition chamber) over the AlN 404. The columnar dimensions of AlN 408 grown over the new template are increased even further compared to FIG. 2 and FIG. 3.

The use of sputter deposition to generate an AlN layer over a template described in FIGS. 2-4 does not deposit sufficiently thick epitaxial continuous bulk AlN layers on a Si substrate and the creates severe wafer bow/warp and subsequent cracking due to strain relaxation in thick layers of AlN. These defects are eliminated by the present disclosure, which provides a practical, real-world route to exploiting the benefit of epitaxially deposited AlN on SEMI standard substrates. Further, the present disclosure offers multiple advantages as compared to the current technologies including superior thickness control, superior interfacial quality, superior bulk AlN quality, reduced contact losses, and increased integration potential.

Figure 5:
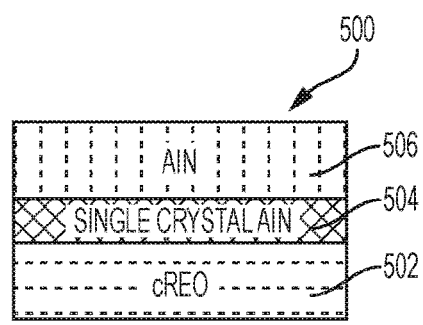
FIG. 5 depicts a schematic representation of a sputtered growth of AlN on a template in accordance an illustrative embodiment.

FIG. 5 depicts a schematic representation 500 that illustrates a continuous bulk crystalline layer of AlN over a template, in accordance with an illustrative embodiment. Schematic representation 500 depicts a layer of single crystal AlN 504 grown on cREO 502 to form a template. Schematic representation 500 depicts an additional AlN layer 506 characterized by some change in material properties within the grown/deposited thickness (i.e. the portion of AlN positioned on the layer of single crystal AlN). In some embodiments, the template includes a single crystal nucleation region and a bulk AlN region. Thus, a cREO/single crystal III-N layer forms a template for the additional growth/deposition of a sufficiently thick layer of III-N material for use in RF filters. The layers 504 and 506 may include the same or different materials, such as In, Al, Ga, or a rare earth material. In some embodiments, the material of layer 504 may be different from the material of layer 506. The measured full width at half maximum (FWHM) of the material of layer 504 would have a narrow FWHM as measured by x-ray as compared to the measured FWHM of the material of layer 506.

Figure 6:
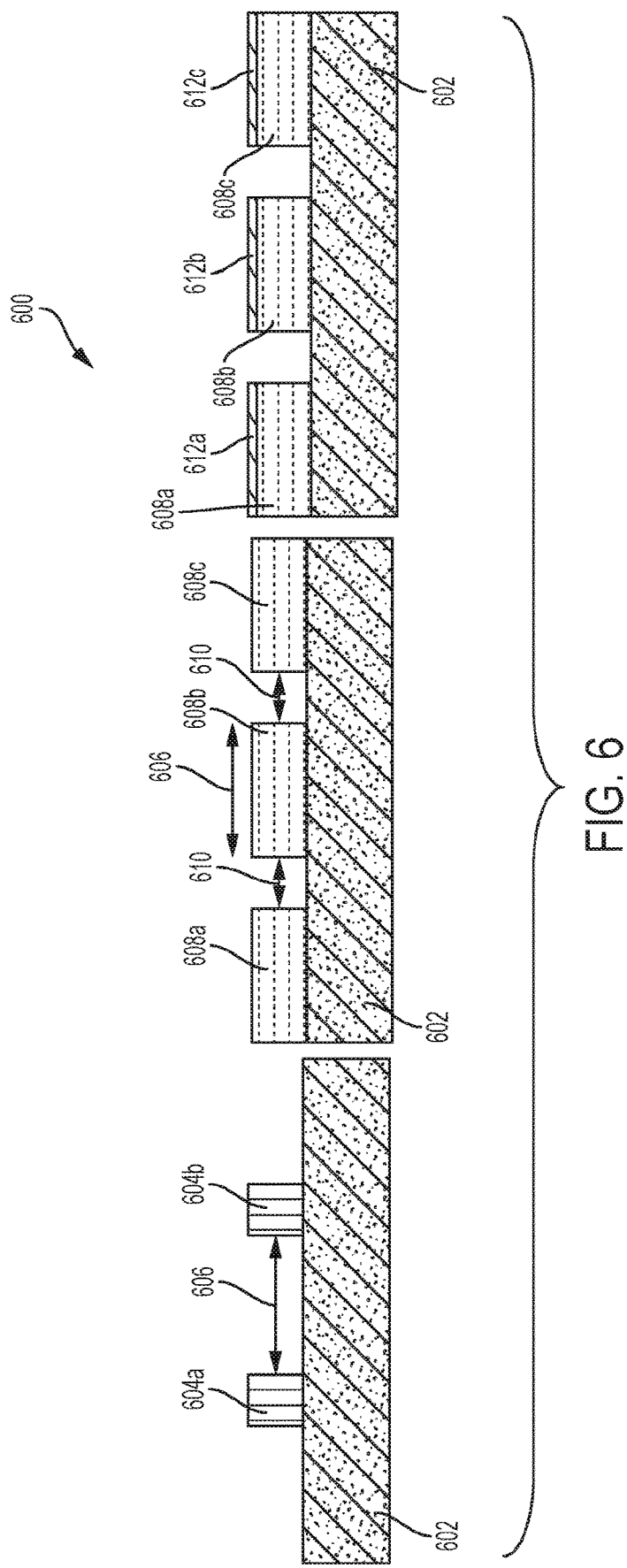
FIG. 6 depicts a schematic diagram of cREO islands on a substrate, in accordance with an illustrative embodiment.

FIG. 6 depicts a schematic diagram of cREO islands grown over substrate 602, in accordance with an illustrative embodiment. The left diagram of schematic representation 600 depicts masking material portions 604a and 604b on the surface of the substrate 602 to define desired gaps 606 for the growth of discrete portions of cREO. For the purposes of this disclosure, discrete portions or discrete regions of cREO may also be referred to as cREO islands. In the middle diagram of schematic representation 600, a layer of cREO is grown in the gaps 606, and the masking material portions 604a and 604b are removed, leaving behind cREO islands 608a, 608b, and 608c separated by gaps 610. In some embodiments, the masking material may be arranged in a specific manner as required to grow cREO islands as per the requirements of a device. In the right diagram of schematic representation 600, a conductive layer 612a, 612b, and 612c is grown over the cREO islands, and is not grown in the absence of a cREO island (e.g., within the gaps 610). In some embodiments, the conductive layers include III-O materials like $In_2O_3$ or a rare earth nitride or a rare earth silicide. This is described in PCT Application No. PCT/US2017/22821, filed on, Mar. 16, 2017 and Provisional U.S. Application 62/398,416, filed on Sep. 22, 2016, which are hereby incorporated herein by reference in their entirety. In some embodiments, the substrate 602 is silicon as described above.

Figure 7:
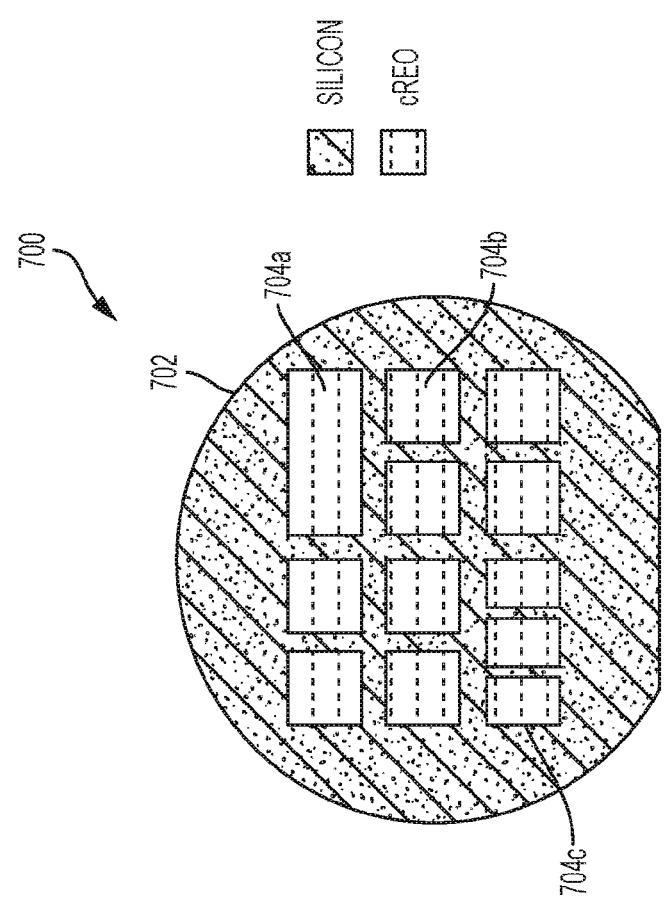
FIG. 7 depicts a top-view of a substrate with islands of cREO, in accordance with an illustrative embodiment.

FIG. 7 depicts a top-view schematic of a substrate with islands of cREO, in accordance with an illustrative embodiment. The schematic representation 700 shows the islands of cREO (e.g., cREO islands 704a, 704b, and 704c, generally, cREO island 704) over a substrate 702. The growth of the cREO islands 704 is described in more detail in relation to FIG. 6. In FIG. 7, twelve cREO islands 704 are depicted, several with different sizes from one another. In general, the dimensions of the various cREO islands 704 may be different from one another or the same as one another. As shown in FIG. 7, the dimensions of various islands of cREO 704a, 704b, and 704c are different, though one will understand that the islands of cREO 704 may have the same or similar shapes and sizes, or different shapes and sizes, without departing from the scope of the present disclosure. In some embodiments, having differing shapes of cREO islands 704 or differing gaps in between cREO islands 704 may be preferable depending on precise device requirements. In some embodiments, the layer of cREO islands over a substrate only represents one layer below other layers that include separated discrete portions of material. In general, other layers may be included in the structure above the cREO islands. In such cases, the layers above the layer of cREO islands may include only discrete portions of material that are deposited on top of the cREO islands themselves, and not elsewhere. The discrete portions of material that are deposited on top of the cREO islands may be the same or different across different cREO islands, where the same or different materials may be at the top surface of the structure. In some embodiments, the layers above the layer of cREO islands form bridges connecting different cREO islands.

Figure 8:
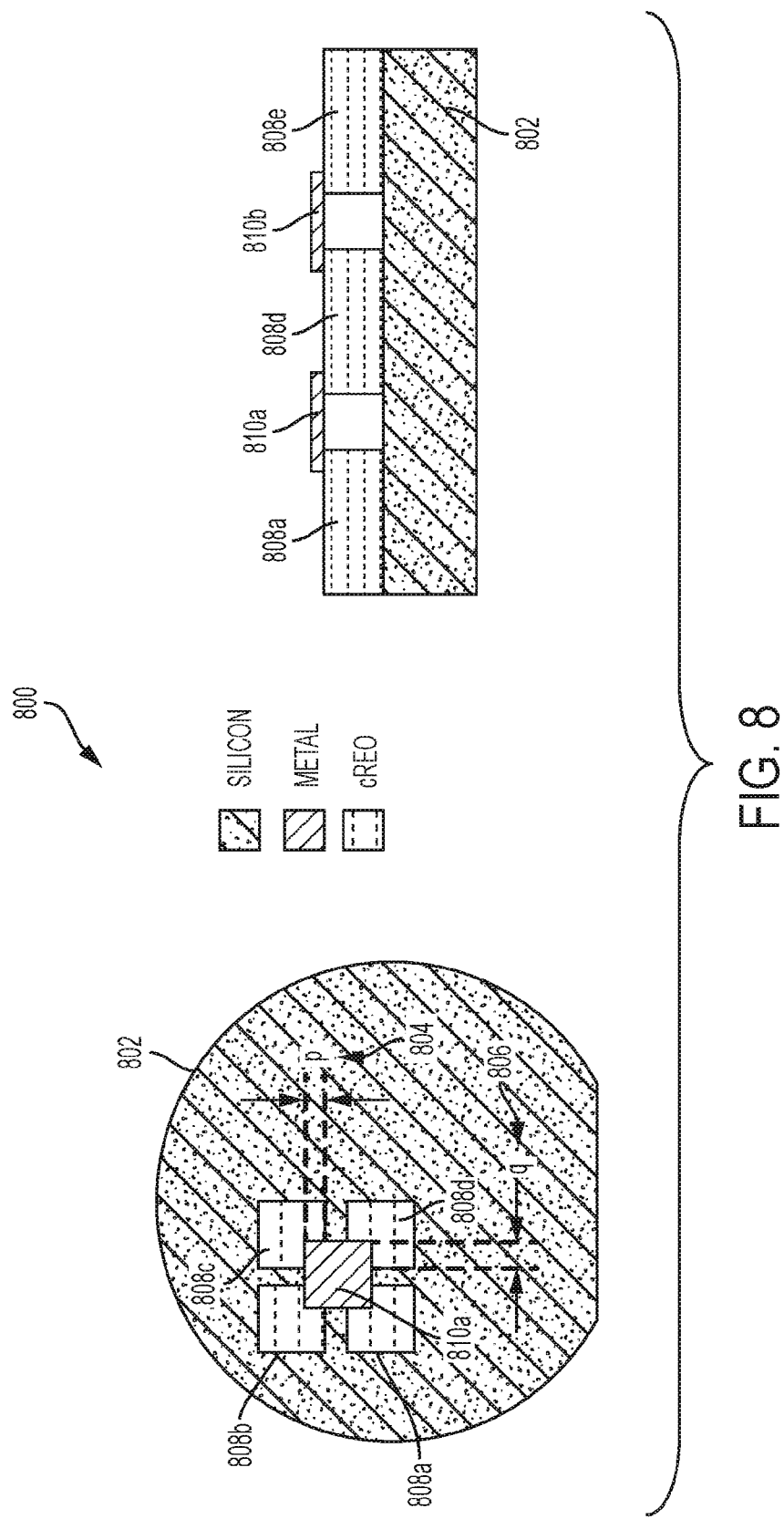
FIG. 8 depicts a schematic representation of a metal deposition over islands of cREO grown over a substrate, in accordance with an illustrative embodiment.

FIG. 8 depicts a schematic representation of a metal deposition over islands of cREO grown over a substrate, in accordance with an illustrative embodiment. Schematic representation 800 depicts a substrate 802 with four cREO islands 808a, 808b, 808c, and 808d. Metal layer 810a is deposited over the cREO islands in such a way that the metal layer overlaps portions of the discrete cREO islands (808a, 808b, 808c, and 808d). While the metal portion 810a is depicted in FIG. 8 as overlapping over four different cREO islands, a metal portion may generally overlap over any suitable number of cREO islands. As is depicted in the left schematic of FIG. 8, the metal layer 810a has dimension 'p' and 'q'. Dimension 'p' represents an amount (which may be a physical dimension, a percentage, or a fraction) of overlap between the metal layer 810a and a dimension (e.g., the vertical dimension in the left schematic of FIG. 8) of the cREO island 808c. Similarly, dimension 'q' represents an amount (which may be a physical dimension, a percentage, or a fraction) overlap between the metal layer 810a and a dimension (e.g., the horizontal dimension in the left schematic of FIG. 8) of the cREO island 808d. In some embodiments, a cREO island may have overlapping deposits of more than one metal layer. As shown in FIG. 8, cREO island 808d has overlapping deposits of metal layer 810a and 810b. The metal layers 810a and 810b may have different percentages of overlap with cREO island 808d. In some embodiments, the 'p' and 'q' values regarding the deposition of the metal layer 810a and 810b depend on whether there is to enough surface area of the epitaxial material to support epi of a III-N layer that is deposited over the metal layer 810a and 810b. In some embodiments, the 'p' and 'q' values should indicate a sufficient metal layer overlap to support the metal based on its mechanical properties.

Figure 9:
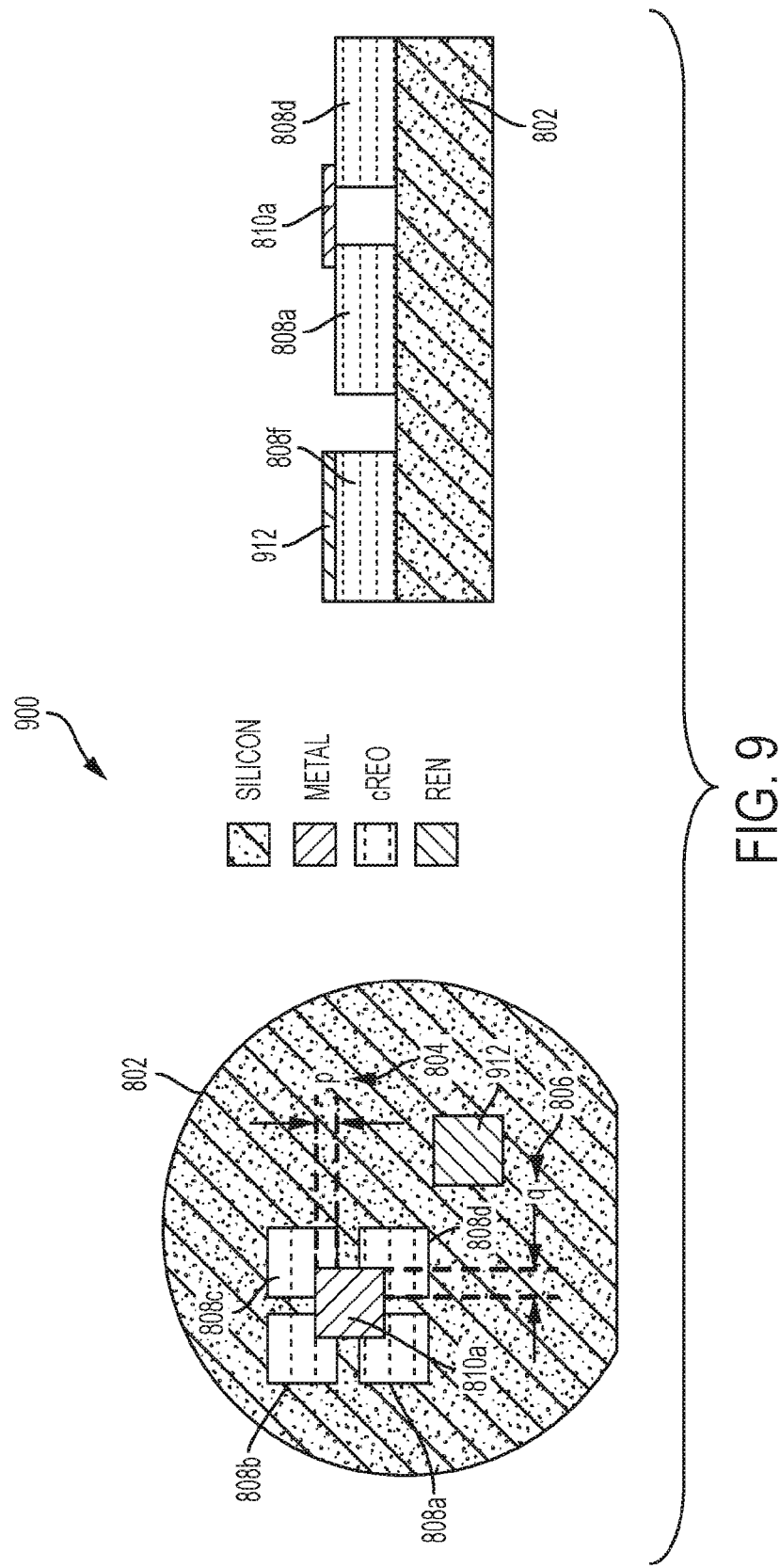
FIG. 9 a schematic representation of a metal deposition and rare earth nitride deposition over islands of cREO grown over a substrate, in accordance with an illustrative embodiment.

FIG. 9 depicts a schematic representation of a metal deposition and a rare earth nitride deposition over islands of cREO grown over a substrate, in accordance with an illustrative embodiment. FIG. 9 is similar to FIG. 8 except that FIG. 9 also depicts a rare earth nitride layer 912 over a cREO island 808f. In some embodiments, a layer of various alloys may be grown over cREO islands that allow the development of discrete filter elements across a substrate with potential to integrate multiple epitaxial based circuit elements. In some embodiments, the rare earth nitride layer may be conductive.

In some embodiments, the cREO islands with overlying metal template 810a and 810b as shown in FIG. 8 is a starting template for additional epitaxial processing. The type of epitaxy to be used may include Epitaxial Lateral Over Growth (ELOG). A key aspect of ELOG is that the exposed cREO surface provides the nucleation site on which the next material is grown. In some embodiments, ELOG is applied to the growth of an additional cREO layer on the exposed portions of the cREO islands, followed by a growth of AlN. In some embodiments, the additional cREO layer grown is different from the cREO islands 808a, 808b, 808c, 808d, and 808e. In some embodiments, the ELOG process is applied to the growth of a second layer chosen for its conductive properties, such as a rare earth nitride, rare earth silicide, a III-oxide, or any suitable combination thereof.

Figure 10:
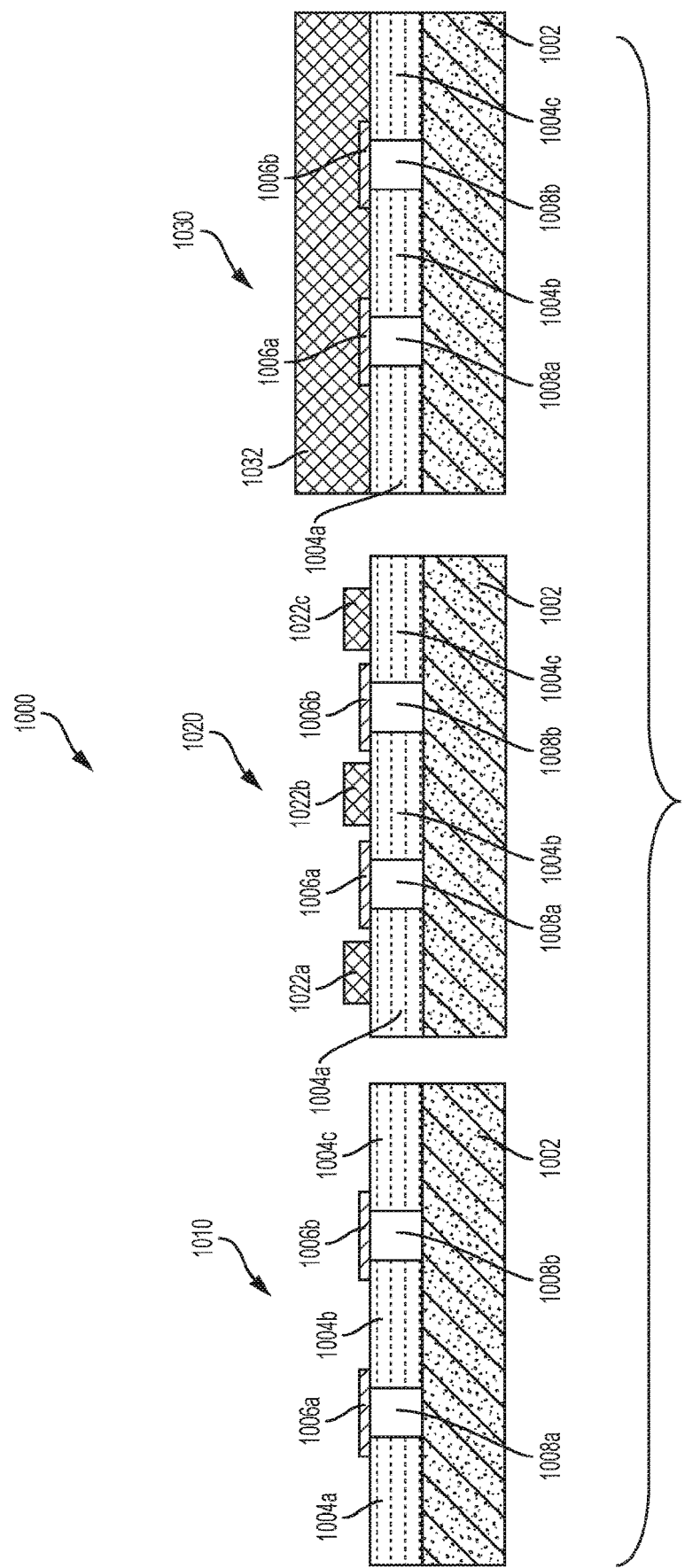
FIG. 10 depicts a schematic representation of a III-N layer over a metal deposition over islands of cREO grown over a substrate, in accordance with an illustrative embodiment.

FIG. 10 depicts a schematic representation of a III-N layer over a metal deposition over islands of cREO grown over a substrate, in accordance with an illustrative embodiment. Starting with the structure of FIG. 8 (replicated as structure 1010 in FIG. 10), cREO islands 1004a, 1004b, and 1004c (generally, cREO island 1004) are grown over substrate 1002, and metal portions 1006a and 1006b (generally, metal portion 1006) form bridges between the cREO islands 1004. The air gaps 1008a and 1008b (generally, air gaps 1008) increase acoustic isolation in the layer structure 1010. In structure 1020, III-N materials 1022a, 1022b, and 1022c (generally, III-N material 1022) are deposited directly on the exposed surfaces of the cREO islands 1004 using ELOG preferential growth conditions. As the III-N material 1022 is grown, it is initially preferentially deposited in separate portions above the cREO islands 1004. As additional III-N material 1022 is grown, the III-N materials 1022a and 1022b extend over metal layer 1006a to join and form a single coalesced layer of the III-N material over the cREO islands 1004a and 1004b. Similarly, III-N materials 1022b and 1022c extend over metal layer 1006b to join and form a single coalesced layer of the III-N material over the cREO islands 1004b and 1004c. Layer structure 1030 depicts the III-N material 1032 grown using ELOG preferential growth conditions over metal depositions 1006a and 1006b deposited over cREO islands 1004a, 1004b, and 1004c grown over substrate 1002. In some embodiments, the substrate 1002 may be silicon.

In some embodiments, the piezoelectric properties of III-N materials such as AlN are influenced by biaxial stress within the film of the III-N materials. The stresses incorporated at the growth temperature of the layer 1032 in FIG. 10 may influence the final stress due to differences in the coefficient of thermal expansion of the materials in layer structure 1032 in FIG. 10. In some embodiments, this stress is balanced by growing one or more different layers over the III-N layer. In some embodiments, the one or more different layers are grown over the III-N layer to create an improved III-N material on a silicon substrate. Different layers that may be grown over the III-N layer are described in more detail in FIG. 11. The superior thickness control, interfacial quality, and bulk quality that is achieved through the described method of growing the III-N layer, devices and processes can be instituted by growing different compounds over the III-N layer.

Figure 11:
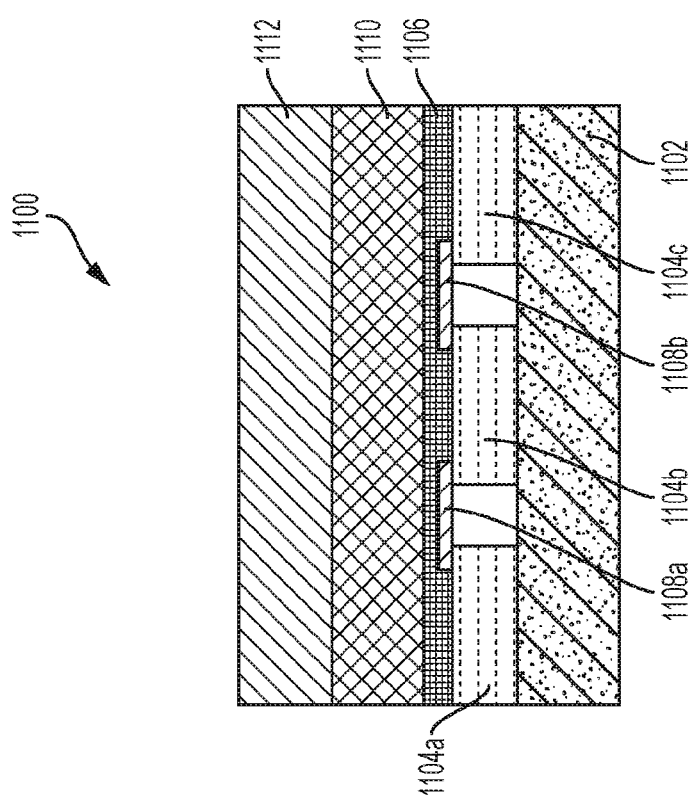
FIG. 11 depicts a schematic representation of an additional layer over the III-N layer over a metal deposition over islands of cREO grown over a substrate, in accordance with an illustrative embodiment.

FIG. 11 depicts a schematic representation of an additional layer over the III-N layer over a metal deposition over islands of cREO grown over a substrate, in accordance with an illustrative embodiment. Schematic representation 1100 includes a substrate 102, over which cREO islands 1104a, 1004b, and 1104c (generally, cREO island 1104) are grown. Metal layers 1108a and 1108b (generally, metal layer 1108) are deposited over the cREO islands 1104 such that the metal layers 1108 form bridges connecting the cREO islands 1104. An additional layer 1106 is grown using the ELOG process as described with respect to FIG. 10 over the cREO islands 1104. In some embodiments, the additional layer 1106 is chosen for its conductive properties, such as a rare earth nitride, rare earth silicide, or a III-oxide. The III-N layer 1110 is grown over the additional layer 1106, and the layer 1112 is grown over the III-N layer. In some embodiments, the layer 1112 is a discrete epi layer. In some embodiments, the inclusion of a discrete alloy or a region of doped III-N within the bulk of the III-N layer 1110 used to form the piezoelectric element may allow the III-N layer to be the basis for growing layer 1112 over the III-N layer 1110 suitable for the need of other devices like switches, amplifiers, photo detectors and emitters. In some embodiments, the discrete epi layer 1112 includes a material such as monoclinic $Gd_2O_3$ or ScN. In some embodiments, the ScN is used to bridge the lattice constant between the III-N layer and a III-V layer over the III-N layer to enhance conductivity. The use of ScN as a buffer layer between a III-N and a III-V layer is described in detail in PCT Application No. PCT/US2017/035794, filed on, Jun. 2, 2016, which is hereby incorporated herein by reference in its entirety.

FIGS. 12-14 depict schematic representations of variations of the substrate over which the layer structure 1030 in FIG. 10 may be grown.

FIG. 12 depicts a schematic representation of an additional layer of silicon oxide over a base silicon substrate, in accordance with an illustrative embodiment. The stack 1210 includes a silicon substrate 1202, a cREO layer 1206a, and a silicon oxide layer 1204a positioned between the silicon substrate 1202 and the cREO layer 1206a. The right diagram of FIG. 12 depicts three implementations of the stack 1210 (represented by the three cREO islands 1206a, 1206b, and 1206c and their corresponding silicon oxide layers 1204a, 1204b, and 1204c, respectively). In general, any number of cREO islands may be used. A III-N layer 1208 is grown over metal deposit layer portions 1212a and 1212b, which bridge the cREO islands 1206. In some embodiments, the III-N layer 1208 is grown using ELOG described in relation to FIG. 10. In some embodiments the additional silicon oxide layer may provide additional stress relief to stack 1210 without compromising the crystal structure of the cREO layer 1206 which supports the ELOG process. In some embodiments, the silicon oxide is enabler for an RF switch under the filter.

FIG. 13 depicts a schematic representation of a layer of silicon oxide sandwiched between two cREO layers, in accordance with an illustrative embodiment. The stack 1310 includes a silicon substrate 1302, a first cREO layer 1304a, a silicon oxide layer 1306a, and a second cREO layer 1308a. In some embodiments, the first cREO layer 1304a and the second cREO layer 1308a may be composed of the same material. The right diagram of FIG. 13 depicts three implementations of the stack 1310 (represented by the three cREO islands 1304a, 1304b, and 1304c and their corresponding silicon oxide layers 1306a, 1306b, and 1306c, respectively). In general, any number of cREO islands may be used. A III-N layer 1314 is grown over metal deposit layer portions 1312a and 1312b, which bridge the cREO islands 1304. In some embodiments, the III-N layer 1208 is grown using ELOG described in relation to FIG. 10.

FIG. 14 depicts a schematic representation of an additional layer of silicon over a cREO island grown over a silicon substrate, in accordance with an illustrative embodiment. The stack 1410 includes a silicon substrate 1402, a cREO layer 1404a, and a silicon layer 1406. The presence of a second silicon layer 1406 provides additional functionality and integration to the layer structures. The middle diagram of FIG. 14 depicts three implementations of the stack 1410 (represented by the three cREO islands 1404a, 1404b, and 1404c and their corresponding silicon layers 1406, respectively). In general, any number of cREO islands may be used. The silicon layer 1406 is coalesced over metal layers 1408a and 1408b. The right diagram of FIG. 14 depicts a coalesced silicon layer 1406 over the cREO islands 1404a, 1404b, and 1404c. A III-N layer 1412 is grown over the coalesced silicon layer 1406, which bridge the cREO islands 1206. In some embodiments, the III-N layer 1412 is grown using ELOG described in relation to FIG. 10. In some embodiments, the layer 1412 may be a discrete epi layer. In some embodiments, the discrete epi layer 1412 may include a material such as monoclinic $Gd_2O_3$ or ScN, which may create a basis for other layers to be grown over the layer to create other devices. See for example, copending U.S. patent application Ser. No. 15/342,045, filed on, Nov. 2, 2016, and is hereby incorporated herein by reference in its entirety. In some embodiments, silicon layer 1406 may provide a better surface onto which start an ELOG process. In some embodiments, the silicon layer 1406 may be grown over only a subset of cREO islands (e.g. cREO island 1404a). In such embodiments, the growth of the III-N layer 1412 over silicon may be a HEMT type structure. In some embodiments, the silicon layer 1406 may be an enabler for an RF switches under the filter.

Figure 15:
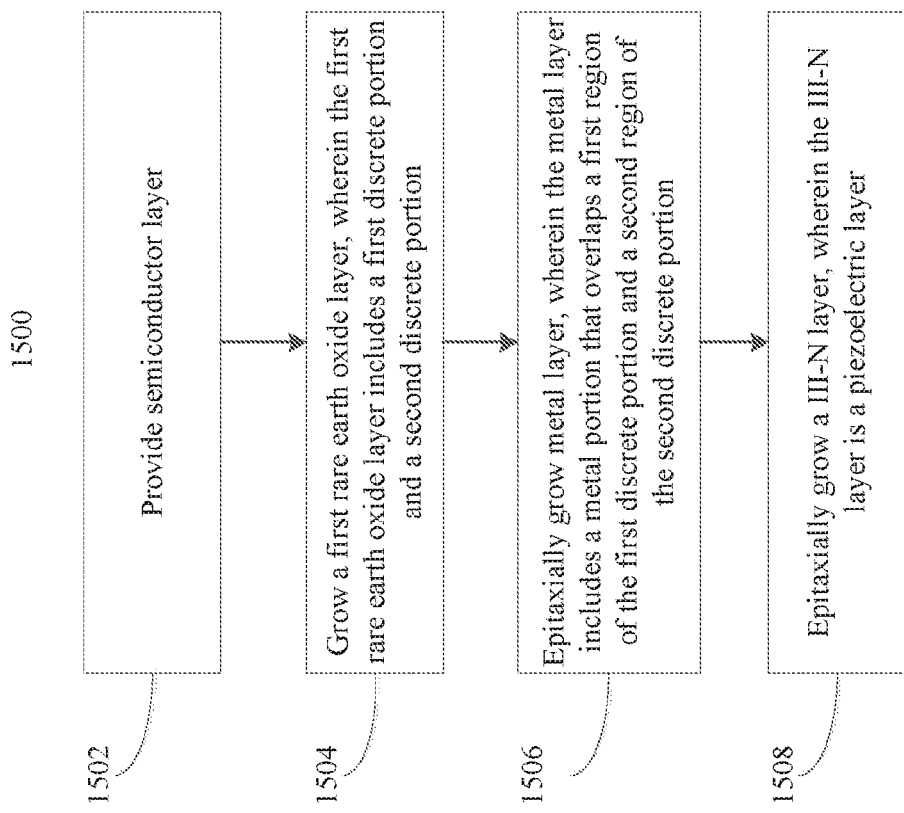
FIG. 15 depicts a flowchart of a method for growing the layer structure shown in FIG. 10, according to an illustrative embodiment.

FIG. 15 is a flowchart of a process 1500 growing the layer structure 1030, according to an illustrative embodiment. The process starts at 1502, when a semiconductor layer 1002 is provided. At 1504, the process begins to grow a first rare earth oxide layer 1004, wherein the first rare earth oxide layer includes a first discrete portion 1004a and a second discrete portion 1004b. At 1506, the process epitaxially grows a metal layer 1006, wherein the metal layer includes a metal portion 1006a that overlaps a first region of the first discrete portion 1004a and a second region of the second discrete portion 1004b. At 1508, the process epitaxially grows a III-N layer 1032, wherein the III-N layer is a piezoelectric layer.

At 1502, the semiconductor layer 1002 is provided. The semiconductor 1002 layer may be a silicon substrate over which the rare earth oxide layer 1004 is grown.

At 1504, the rare earth oxide layer 1004 is epitaxially grown over the first semiconductor layer 1002, wherein the first rare earth oxide layer 1004 includes a first discrete portion 1004a and a second discrete portion 1004b. The process of growing the discrete portions 1004a and 1004b in rare earth oxide layer 1004 is described in detail in FIG. 6.

At 1506, the metal layer 1006 is epitaxially grown over the rare earth oxide layer 1004, wherein the metal layer 1006 includes a metal portion 1006a that overlaps a first region 1004a of the first discrete portion 1004a and a second region of the second discrete portion 1004b. In some embodiments, bridging the first discrete portion 1004a and 1004b would most likely be done ex-situ and use standard deposition techniques like lithography with photoresists to initially fill in the gaps whilst metal is being deposited.

At 1508, the III-N layer 1032 is epitaxially grown over the metal layer 1006, wherein the III-N 1032 layer is a piezoelectric layer. The growth of the III-N layer 1032 is described in detail in FIG. 10.

The lanthanide series includes the metals cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Throughout this disclosure it should be understood that the term rare-earth elements or rare-earth metals includes scandium and yttrium, as well as all lanthanides.

The growth and/or deposition described herein can be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HYPE), pulsed laser deposition (PLD), and/or physical vapor deposition (PVD).

III-nitride (III-N) materials are semiconducting materials comprising nitrogen and one or more Group III elements. Common Group III elements used to form III-nitride materials include aluminum, gallium, and indium. III-nitride materials have large direct band gaps, making them useful for high-voltage devices, radio-frequency devices, and optical devices. Furthermore, because multiple Group III elements can be combined in a single III-nitride film in varying compositions, the properties of III-nitride films are highly tunable.

In some embodiments, the III-V and III-nitride materials used in the layer structures described herein are grown using metal-organic chemical vapor deposition (MOCVD). In MOCVD, one or more Group III precursors react with a Group V precursor to deposit a III-nitride film on a substrate. Some Group III precursors include trimethylgallium (TMGa) as a gallium source, trimethylaluminum (TMA) as an aluminum source, and trimethylindium (TMI) as an indium source. Ammonia is a Group V precursor which can be used as a nitrogen source. Tert-butylarsine and arsine are Group V precursors which can be used as arsenic sources. Tert-butylphosphine and phosphine are Group V precursors which can be used as phosphorous sources.

In some embodiments, the III-V and III-nitride materials used in the layer structures described herein are grown using molecular beam epitaxy (MBE). MBE is an epitaxy method for thin-film deposition of single crystals that takes place in high or ultra-high vacuum. In MBE, precise beams of gaseous atoms or molecules are fired at a heated substrate. When the molecules land on the substrate's surface, they condense and build up slowly and systematically in ultra-thin layers.

As described herein, a layer means a substantially-uniform thickness of a material covering a surface. A layer can be either continuous or discontinuous (i.e., having gaps between regions of the material). For example, a layer can completely cover a surface, or be segmented into discrete regions, discrete portions, which collectively define the layer (i.e., regions formed using selective-area epitaxy). A layer may also be a blanket layer, over a specified area. A layer structure means a set of layers, and can be a stand-alone structure or part of a larger structure.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in direct contact with the substrate; or (2) the material is in contact with one or more transitional layers that reside on the substrate.

Single-crystal means a crystal structure that comprises substantially only one type of unit-cell. A single-crystal layer, however, may exhibit some crystal defects such as stacking faults, dislocations, or other commonly occurring crystal defects.

Single-domain (or monocrystal) means a crystalline structure that comprises substantially only one structure of unit-cell and substantially only one orientation of that unit cell. In other words, a single-domain crystal exhibits no twinning or anti-phase domains.

Single-phase means a crystal structure that is both single-crystal and single-domain.

Crystalline means a crystal structure that is substantially single-crystal and substantially single-domain. Crystallinity means the degree to which a crystal structure is single-crystal and single-domain. A highly crystalline structure would be almost entirely, or entirely single-crystal and single-domain.

Epitaxy, epitaxial growth, and epitaxial deposition refer to growth or deposition of a crystalline layer on a crystalline substrate. The crystalline layer is referred to as an epitaxial layer.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, gallium nitride, silicon carbide, gallium oxide, germanium, alumina, gallium-arsenide, indium-phosphide, silica, silicon dioxide, borosilicate glass, pyrex, and sapphire.

A rare earth pnictide material is a material that contains one or more group V elements and one, two, or more rare earth (RE) elements. The rare earth elements include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), luthium (Lu), scandium (Sc) and yttrium (Y).

Semiconductor-on-Insulator means a composition that comprises a single-crystal semiconductor layer, a single-phase dielectric layer, and a substrate, wherein the dielectric layer is interposed between the semiconductor layer and the substrate. This structure may include silicon-on-insulator ("SOI") compositions.

Carrier concentration means the number of majority carriers per unit volume.

Charge carrier density denotes the number of charge carriers per volume.

Interface means the surface between two layers or regions of dissimilar crystalline semiconductors.

Semiconductor-on-insulator compositions include but are not limited to a silicon, germanium, or silicon-germanium "active" layer. In other words, exemplary semiconductor-on-insulator compositions include, without limitation: silicon-on-insulator, germanium-on-insulator, and silicon-germanium-on-insulator. In some embodiments, various structures of silicon that may be used are Si<100>, Si<110>, Si<111>, for example.

A first layer described and/or depicted herein as "on" or "over" a second layer can be immediately adjacent to the second layer, or one or more intervening layers can be between the first and second layers. An intervening layer described and/or depicted as "between" first and second layers can be immediately adjacent to the first and/or the second layers, or one or more additional intervening layers may be between the intervening layer and the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results. Additionally, the different examples described are not singular examples and features from one example may be included within the other disclosed examples. Accordingly, it will be understood that the claims are not to be limited to the examples disclosed herein, but is to be understood from the technical teachings provided above, as those teachings will inform the person of skill in the art.

What is claimed is:

1. A layer structure comprising:
   a semiconductor layer;
   a first rare earth oxide layer over the semiconductor layer, wherein the first rare earth oxide layer includes a first discrete portion and a second discrete portion;
   a metal layer epitaxially grown over the first rare earth oxide layer, wherein the metal layer includes a metal portion that overlaps a first region of the first discrete portion and a second region of the second discrete portion; and
   a III-N layer epitaxially grown over the metal layer, wherein the III-N layer is a crystalline piezoelectric layer.

2. The layer structure of claim 1, wherein the III-N layer and the metal portion form a bridge over the first discrete portion and the second discrete portion.

3. The layer structure of claim 1, wherein the semiconductor layer and the III-N layer are blanket layers.

4. The layer structure of claim 1, wherein the first rare earth oxide layer further includes a third discrete portion, and wherein an additional layer is positioned between the third discrete portion of the first rare earth oxide layer and the III-N layer.

5. The layer structure of claim 4, wherein the metal layer does not include any metal grown over the third discrete portion.

6. The layer structure of claim 4, wherein the additional layer is a blanket layer.

7. The layer structure of claim 4, wherein the additional layer includes a second rare earth oxide layer.

8. The layer structure of claim 4, wherein the additional layer includes at least one of a rare earth nitride, a rare earth silicide, and a III-O, and wherein the additional layer improves conductivity of the layer structure.

9. The layer structure of claim 1, wherein at least a portion of the III-N layer is grown using epitaxial lateral over growth (ELOG).

10. The layer structure of claim 1, further comprising a silicon oxide layer positioned between the semiconductor layer and the first rare earth oxide layer.

11. The layer structure of claim 1, wherein the III-N layer includes one or more of AlN, Al, Ga, and In.

12. The layer structure of claim 1, wherein the III-N layer includes an alloy of AlN and a rare earth metal.

13. The layer structure of claim 1, further comprising an additional rare earth oxide layer that is epitaxially grown over the III-N layer.

14. The layer structure of claim 1, further comprising a layer of ScN over the III-N layer.

15. The layer structure of claim 14, further comprising a III-V layer over the ScN layer.

* * * * *